(12) United States Patent
Cranford, Jr. et al.

(10) Patent No.: US 8,054,926 B2
(45) Date of Patent: *Nov. 8, 2011

(54) CLOCK AND DATA RECOVERY SYSTEM AND METHOD FOR CLOCK AND DATA RECOVERY BASED ON A FORWARD ERROR CORRECTION

(75) Inventors: Hayden Clavie Cranford, Jr., Cary, NC (US); Martin L. Schmatz, Rueschlikon (CH); Thomas H. Toifl, Zurich (CH)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 12/116,151

(22) Filed: May 6, 2008

(65) Prior Publication Data
US 2008/0209296 A1  Aug. 28, 2008

Related U.S. Application Data

(63) Continuation of application No. 11/214,161, filed on Aug. 29, 2005, now Pat. No. 7,522,687.

(51) Int. Cl.
*H04L 7/00* (2006.01)

(52) U.S. Cl. .......................... 375/355; 375/371

(58) Field of Classification Search .......... 375/355, 375/371, 373, 376
See application file for complete search history.

(56) References Cited

U.S. PATENT DOCUMENTS

| | | | | |
|---|---|---|---|---|
| 5,939,916 A * | 8/1999 | Jamal et al. | ................ | 327/231 |
| 6,034,998 A * | 3/2000 | Takashi et al. | ................ | 375/294 |
| 6,536,001 B1 * | 3/2003 | Cai et al. | ................ | 714/701 |
| 7,292,629 B2 * | 11/2007 | Zerbe et al. | ................ | 375/229 |
| 2002/0116667 A1 * | 8/2002 | McEwen et al. | ................ | 714/39 |
| 2004/0156441 A1 * | 8/2004 | Peeters et al. | ................ | 375/260 |
| 2004/0258185 A1 * | 12/2004 | Kihara | ................ | 375/371 |
| 2005/0058234 A1 * | 3/2005 | Stojanovic | ................ | 375/371 |
| 2006/0062339 A1 * | 3/2006 | Briones | ................ | 375/375 |

* cited by examiner

*Primary Examiner* — David Lugo
(74) *Attorney, Agent, or Firm* — Daniel P. Morris; McGinn IP Law Group, PLLC

(57) ABSTRACT

The forward error correction based clock and data recovery system includes a data latch for intermediately storing received data, which is triggered by a sampling clock. The system further includes an error determination unit for determining whether which of the sampled received data is wrong, and for generating out of it a phase/frequency correction signal. Furthermore, the system includes a clock generator for generating the sampling clock depending on the correction signal.

18 Claims, 4 Drawing Sheets

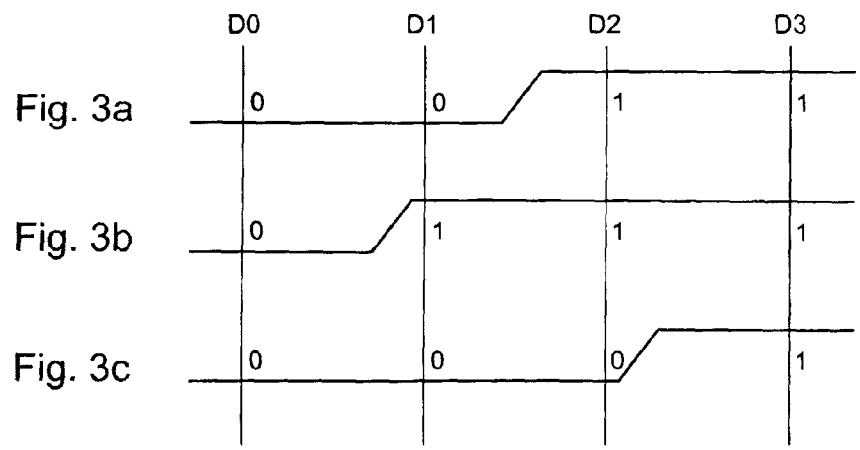
Fig. 3a
Fig. 3b
Fig. 3c
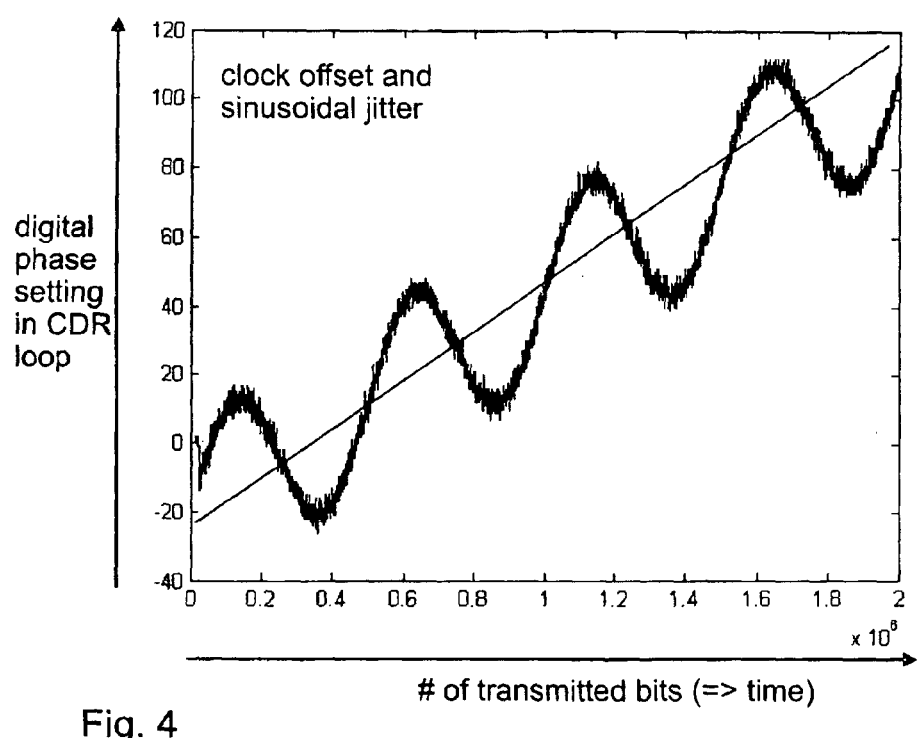
Fig. 4

CLOCK AND DATA RECOVERY SYSTEM AND METHOD FOR CLOCK AND DATA RECOVERY BASED ON A FORWARD ERROR CORRECTION

CROSS-REFERENCE TO RELATED APPLICATIONS

The present application is a Continuation Application of U.S. patent application Ser. No. 11/214,161 filed on Aug. 29, 2005 now U.S. Pat. No. 7,522,687, now U.S. Pat. Publ. No. US 2007-0061665 A1 published on Mar. 15, 2007.

TECHNICAL FIELD

The present invention relates to a forward error correction based clock and data recovery system and to a method for data and clock recovery in the forward error correction based clock and data recovery system.

BACKGROUND OF THE INVENTION

Clock data recovery, CDR, loops in serial data transmission links measure the position of the transition between logic states ie. one-to-zero, zero-to-one, or multilevel-transitions. This requires high-speed sampling latches in the receiver front end, a high-speed phase detection logic function and the appropriate clock generation building blocks, e.g. I/Q generator, or multiphase generators. There are two distinct problems associated with that traditional approach. First, both the sampling latches associated with to the measurement of the logic transitions, as well as the phase detector circuits require a significant amount of direct current, DC, power to be operated at high speed. Secondly, the accuracy of the logic transition measurement is prone to errors, e.g. due to latch offsets, different clock wire length, and device mismatches etc. At high frequencies, this error is contributing a significant amount of jitter to the jitter budget of a serial link. Many modern serial links are leveraging forward error correction, FEC, codes, e.g. Hamming codes. These codes can typically detect and correct one or more errors in the receiver based on the transmission of a limited number of additional parity bits. In typical serial links, single errors in a reasonable sized stream of bits are dominating.

Forward error correction is a method to improve connection quality in digital communication systems. Forward in conjunction with error correction means the correction of transmission errors at the receiver side without any additional information from the transmitter. The theoretical background of FEC is given by information theory. The main concept of FEC is to add a certain amount of redundancy to the information, which can be exploited by the receiver to correct transmission errors due to channel noise. In the literature FEC coding is therefore often described as channel coding. C. Shannon presented in his mathematical theory of communication, that every transmission channel has a theoretical maximum capacity, called channel capacity, which depends on the bandwidth and the signal-to-noise ratio. The capacity of most implemented systems is much smaller than the maximum possible value suggested by the theory. As a consequence the use of suitable codes will allow further improvement of bandwidth efficiency. A very simple example, which explains the principle of FEC, is the use of repetition coding: if a system transmits every message three times, the receiver is able to correct one corrupted message by a simple majority decision. The coding theory shows, that this method is very ineffective, because the maximum data rate is reduced to one third of the channel data rate. A large variety of more efficient codes have been developed, and the progress in microelectronics has enabled modern communication protocols to implement them in real-time applications.

The error correcting codes can be divided in two main families: block codes and convolutional codes. Block codes add a constant number of parity bits to a block of information bits, whereas convolutional codes generate a modified output bit stream with a higher rate than the input stream. The various codes have different properties with respect to error correction performance and decoding complexity. Additionally, for a real system design factors like block size and scalability should be considered.

When using block codes the data to be transmitted is segmented into blocks of a fixed length k. To each block a certain amount of parity bits are added. The information bits and the parity bits together form the code words of length n. The rate r of a (n, k) block code is defined as $r=k/n$. Block codes might be separated in two main families: binary and non-binary codes. Examples for binary codes are Cyclic, Hamming, Hadamard, Fire, Golay and BCH codes. The non-binary codes work on symbols consisting of more than one bit. The most popular example are the Reed-Solomon codes, which form are derived from binary BCH codes.

All practically used block codes are linear. This means, that the modulo-2 addition of two code words is also a valid code word. Linear block codes have several properties, which are helpful for practical implementation. The codes can be defined in form of a generator and a parity check matrix. The error syndrome concept can be used to detect and correct errors on the receiver side. More information about the forward error correction can be found in Robert H. Morelos-Zaragoza, "The Art of Error Correcting Coding", John Wiley & Sons, Apr. 19, 2002.

In FIG. 1 a block diagram of a clock data recovery, CDR, loop according to the prior art is depicted. The receiver 1 comprises a serial data input connected via a preamplifier 2 to a data latch 3 and an edge latch 4, wherein the data latch 3 intermediately stores the value of the sampled input data signal and the edge latch 4 intermediately stores the transition between different logic states. Both the data latch 3 and the edge latch 4 are sampling latches and their outputs are coupled to a block collection unit 8, which converts serial input data to parallel output data. The CDR loop further comprises a phase detection unit 9, which determines by means of the sampled data and edges a phase correction signal Δϕ. The phase correction signal Δϕ is lead to a loop filer and phase rotator control 10, which generates out of it a control signal ctrl for a phase rotator 5. The phase rotator 5 in turn generates out of the control signal ctrl a first sample clock sclkd for sampling the data and a second sampling clock sclke for sampling the edges. The first sample clock sclkd provides the sampling points for the data latch 3 and the second sampling clock sclke provides the sampling points for the edge latch 4. A further input of the phase rotator 5 is connected to an oscillator 7 and an clock buffer 6, which provide a reference clock refclk. The data collection unit delivers its parallel output data also to an error syndrome calculation unit 11 and a data logic 12. The error syndrome calculation unit 15 is used to detect single errors in the collected input data. Its output is used in the data logic 12 together with the collected data of the block collection unit 8 to allocate n error free parallel data at the output of the data logic 12. Finally, a startup-logic 13 is provided to start-up the data logic 12. The data logic 12 also de-skews and scrambles the data and is used for training. With the help of the training the boundaries of the individual data blocks, of which many are transmitted serially, are determined. The data blocks are connected back-to-back in the serial data stream without explicit boundaries between the data blocks. However, the error syndrome calculation unit 15 requires the bits of each data block to be reordered to their original sequence. This initialization, which can for example be done by transmitting known data patterns during a startup phase, is called training.

In Gu-Yeon Wei, Jaeha Kim, Dean Liu, Stefanos Sidiropoulos, and Mark A. Horowitz, "A variable-frequency parallel I/O interface with adaptive power-supply regulation", IEEE Journal of solid-state circuits, vol. 35, no. 11, November 2000, p. 1600-1610, a similar CDR loop is depicted.

As noted above, these approaches require several high-speed sampling latches in the receiver front end, a high-speed phase detection logic function, and an appropriate multiphase generator for clock generation. The data latch 3 and the edge latch 4 and the generation of their respective clock signals, as well as the phase detection unit 9 require a significant amount of DC power to be operated at high speed. Furthermore, the accuracy of the logic transition measurement is prone to errors, e.g. due to latch offsets, different clock wire length, device mismatches etc. At high frequencies, this error is contributing a significant amount of jitter to the jitter budget of the serial data link.

SUMMARY OF THE INVENTION

According to a first aspect of the present invention there is provided a forward error correction based clock and data recovery system comprising a sampling latch for intermediately storing received data, which is triggered by a sampling clock. The system further comprises an error determination unit for determining whether and which of the sampled received data is wrong, and for generating out of it a phase/frequency correction signal. Furthermore, the system comprises a clock generator for generating the sampling clock depending on the correction signal.

Advantageously, the present invention enables the circuit area, the complexity of the circuit, and the jitter, each to be reduced relative to prior art systems. Furthermore, the present system has a relatively low power consumption.

In one embodiment of the invention the clock generator of the system comprises an adjusting device for adjusting the phase or frequency of the sampling clock. Technical constraints determine whether adjustment of the phase or alternatively adjustment of the frequency of the sampling clock may be performed. In some applications, e.g. in a plesiochronous data transmission link, it might be more helpful to adjust the frequency while in other applications it might be more helpful to adjust the phase. It should be noted that a continuous adjustment of the phase is mathematically equivalent to an adjustment of the frequency.

Preferably, the adjusting device is a phase rotator, a phase interpolator, a voltage controlled oscillator or a current controlled oscillator.

In another embodiment the system comprises a preamplifier for amplifying the received data, which is disposed upstream of the sampling latch.

In a further embodiment the system comprises a data collection unit for block by block collecting the sampled data, wherein the data collection unit is connected between the sampling latch and the error determination unit. By means of the data collection unit the serial received and sampled data can be collected and can be afterwards transferred to the error determination unit in parallel. With that the number of error calculations, which have to be processed by the error determination unit, can be reduced. If for example, the data collection unit collects 40 bits and transfers them afterwards in one block to the error determination unit, the speed of error determination unit can be reduced to $\frac{1}{40}$ of the data rate at the input of the system.

Furthermore, the forward error correction can use a Hamming code or a Reed Solomon code or a convolutional code. Also, the system can have a digital filter, which is connected between the error determination unit and the phase adjusting device.

According to another embodiment of the invention the system can be used in a serial data transmission link.

Depending on the application, the system can be used for a synchronous, plesiochronous, or asynchronous data transmission link.

The system according to the invention can also be used for multi level data transmission, duo-binary transmission, phase modulated transmission or combined phase/amplitude transmissions. Also, the system can be used for data transmission with pulse amplitude modulation.

According to a second aspect of the present invention there is provided a method for data and clock recovery in a forward error correction based clock and data recovery system, comprising the following steps: a receiving step for receiving a data signal and sampling step for sampling the data signal and a storing step for storing the sampled data signal in a sampling latch, triggered by a sampling clock, a reading out step for reading out a value of the sampled data signal in an error determination unit, an evaluating step for evaluating by means of the error determination unit whether the value of the sampled data is wrong, and in the case where the value is wrong, an adjusting step for adjusting the sampling clock by means of an adjusting device.

Preferably, the adjusting step further comprises, adjusting the sampling clock as follows: the phase of the sampling clock is increased, if the value of the data is wrong and in addition unequal to the value of the previous data, the phase of the sampling clock is decreased, if the value of the data is wrong and in addition equal to the value of the previous data.

BRIEF DESCRIPTION OF THE DRAWINGS

The invention and its embodiments will be more fully appreciated by reference to the following detailed description of presently exemplary but nonetheless illustrative embodiments in accordance with the present invention when taken in conjunction with the accompanying drawings.

The figures illustrate.

DETAILED DESCRIPTION OF THE DRAWINGS

Figure 2:
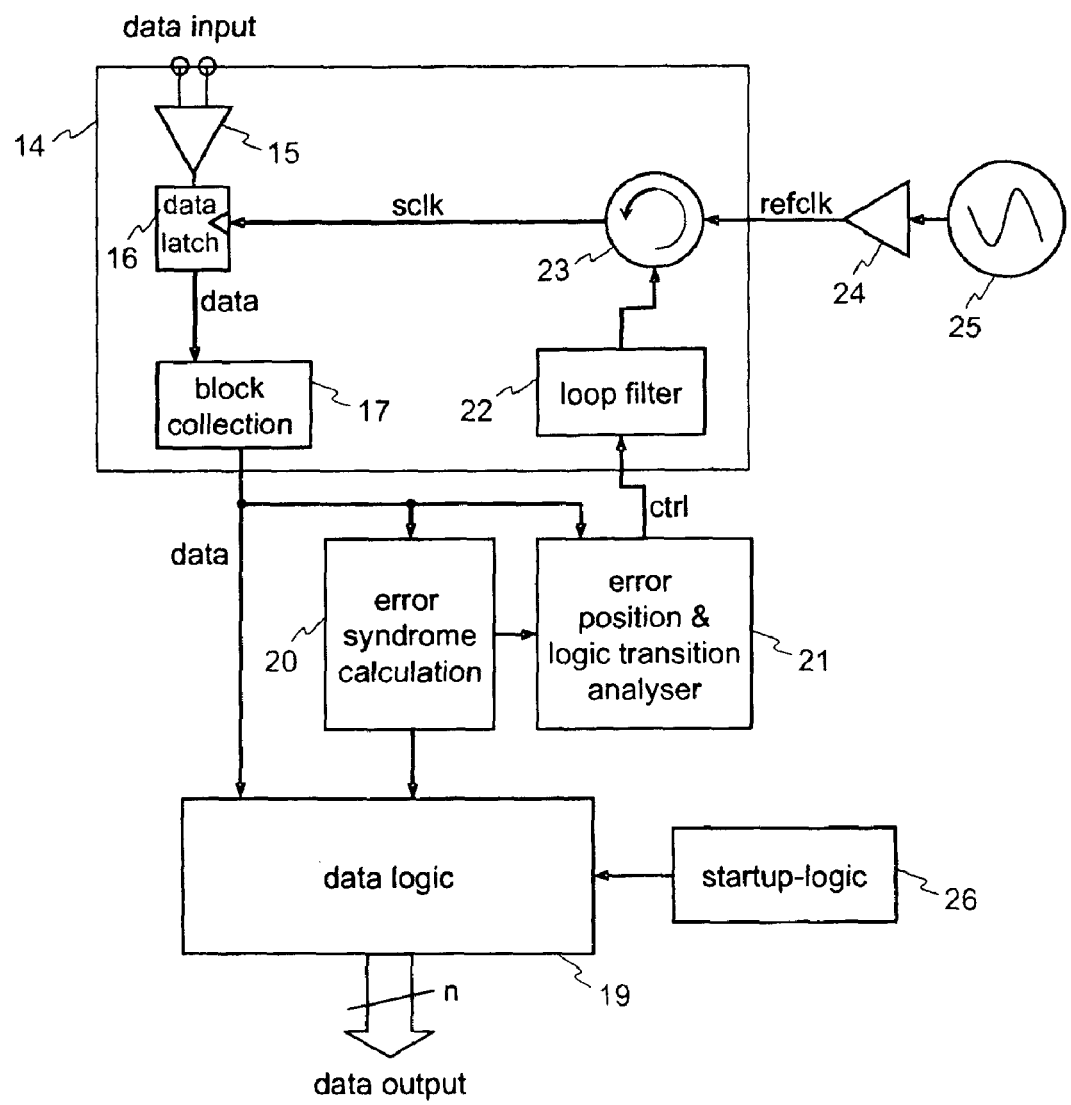

In FIG. 2 a block diagram of an embodiment of the forward error correction based clock and data recovery system according to the invention is shown. A receiver 14 comprises a serial data input connected via a preamplifier 15 to a data latch 16, wherein the data latch 16 is triggered by a sampling clock sclk and intermediately stores the value of the sampled input data signal. The output of the data latch 16 is connected to a block collection unit 17, which collects the sampled data block by block. With that, the serial received input data are converted to parallel data. The block collection unit 17 allocates the parallel data to a data logic 19, an error syndrome calculation unit 20 and a unit for error position and logic transition analysis 21. The error syndrome calculation unit 20 determines on the basis of the sampled data whether these data are error free. If the data block contains an error, the unit for error position and logic transition analysis 21 determines on the basis of the error whether the phase of the sampling clock should be increased or decreased. Instead of that, the unit for error position and logic transition analysis 21 may also determine on the basis of the error whether the frequency of the sampling clock should be increased or decreased. The unit for error position and logic transition analysis 21 generates an appropriate control signal ctrl, which is lead via a loop filter 22 to a phase or frequency adjusting device 23. The adjusting device 23 in turn adjusts a reference clock refclk depending on the correction signal ctrl and thus generates the sampling clock sclk. The reference clock refclk is derived from an oscillator or a RF-phase locked loop 25 and a downstream clock buffer 24. The adjusting device 23, the clock buffer 24 and the oscillator may be known as a clock generator. The error syndrome calculation unit 20 is also connected to the data logic 19, which carries out the error correction, de-skewing, scrambling, training, etc., and allocates at its output n error free parallel data. Finally, a startup-logic 26 is provided to start-up the data logic 19.

The phase or frequency adjusting device 23 may be formed as a phase interpolator, a phase rotator, a voltage controlled oscillator, or a current controlled oscillator.

The data latch 16 can be formed as described in V. G. Oklobdzija, "Clocking and clocked storage elements in a multi-gigahertz environment", IBM J. RES. & DEV. VOL. 47 NO. 5/6 September/November 2003.

In contrast to the prior art, in the present invention it may not be a requirement to measure the data-to-clock phase relationship directly, thereby omitting the additional front end sampling latches to detect the data edges and therefore also omitting all circuits that would generate the clock signals for those sampling latches. Furthermore, in the present invention the high-speed phase detector function may be avoided. This relatively reduces power, area and circuit complexity in the receiver of a serial data link. In order to implement a clock-data-recovery loop, an analysis of data errors is performed, which is described in the next section. The insight that single errors in a timing noise limited system can only occur immediately before or after a logic transition is utilized in the present invention. Based on the error position, e.g. before or after a transition an 'Up' or 'Down' signal, also called correction signal ctrl, is generated that can be used to control the phase or frequency adjusting device 23 to constantly move the data sample at the optimum position. It is noted that firstly, the constant phase adjustment means that the principle may deal with frequency offsets between the transmitter and the receiver, thus achieving asynchronous operation. Secondly, this principle may allow the theoretical minimum of using only one sample per bit in the front end translating in minimum power, area, and complexity. Thirdly, further savings in the power consumption may be achieved by making use of the fact that only in case of a detected error, the Up-Down logic, which controls any phase/frequency adjustments, is turned on. Due to the fact that the target bit error rate is relatively small, e.g. <1e-9, the logic is infrequently active, and thus, the logic consumes relatively little power. Fourthly, further power saving may come from the fact that an encoded block of data is transmitted serially, but analyzed in parallel representation. This implicitly means that the analysis happens at a clock rate that is by several multiples smaller than the clock rate in the receiver front end. In the following, the units 20 and 21 together are also called error determination unit.

In the following, the function of the unit for error position and logic transition analysis 21, which is used for analyzing the error position and the logic transition, is described by means of FIG. 3a, FIG. 3b, FIG. 3c.

In FIG. 3a the logic transition is positioned 50%-50% between the two bits D1 and D2, therefore, both bits are error free, and no 'up'-'down' signal is generated.

In FIG. 3b the phase of the clock has shifted so far to the right, that the bit D1 is wrongly detected as a "1". This flags an error for this bit position, so that one knows it should have been a "0". Because the previous bit D0 was a "0", one can derive that the clock has shifted left and consequently generate a 'up' signal as control signal ctrl to correct the early phase rotator setting.

In FIG. 3c the phase of the clock has shifted so far to the left, that the bit D2 is wrongly detected as "0". In analogy to above, it may be derived that the clock has shifted right, and consequently the unit error position and logic transition analysis 21 generates a 'down' signal as control signal ctrl to correct the late phase rotator setting.

If the error syndrome calculation unit 20 detects by means of the error correction code that a sampled bit $D_x$ is "1" but should be "0", one may conclude out of it that a sampling error exists. To decide whether the sampling should take place earlier or later one may consider the previous sampled bit $D_{x-1}$. If the previous sampled bit $D_{x-1}$ is "0", one knows that the sampling of bit $D_x$ should have taken place later and the phase can be increased or the frequency can be decreased. Whereas, if the previous sampled bit $D_{x-1}$ is "1", one knows that the sampling of bit $D_x$ should have taken place earlier and the phase can be increased or the frequency decreased correspondingly.

In general, the phase of the sampling clock sclk is increased, if the error syndrome calculation unit 20 detects that the value of the bit $D_x$ is wrong and in addition unequal to the value of the previous bit $D_{x-1}$. Whereas the phase of the sampling clock sclk is decreased, if the value of the bit $D_x$ is wrong and in addition equal to the value of the previous bit $D_{x-1}$.

In FIG. 4 a jitter diagram is depicted with the phase rotator digital phase position on the y-axis and the number of transmitted bits on the x-axis. The slope of curve is indicating a frequency offset and therefore an asynchronous operation. The sinusoidal wobbling in the curve is the simulation of short term temporary phase fluctuations. As indicated in the diagram of FIG. 4, the system simulation shows that the phase rotator 23 follows an input data jitter that consists of a frequency offset and some sinusoidal jitter. To mimic a real world transmission system closely, the system simulation includes random jitter, RJ, components to reflect presence of random processes with Gaussian probability density function and deterministic jitter, DJ, components to reflect presence of jitter components which are data dependent.

Figure 1:
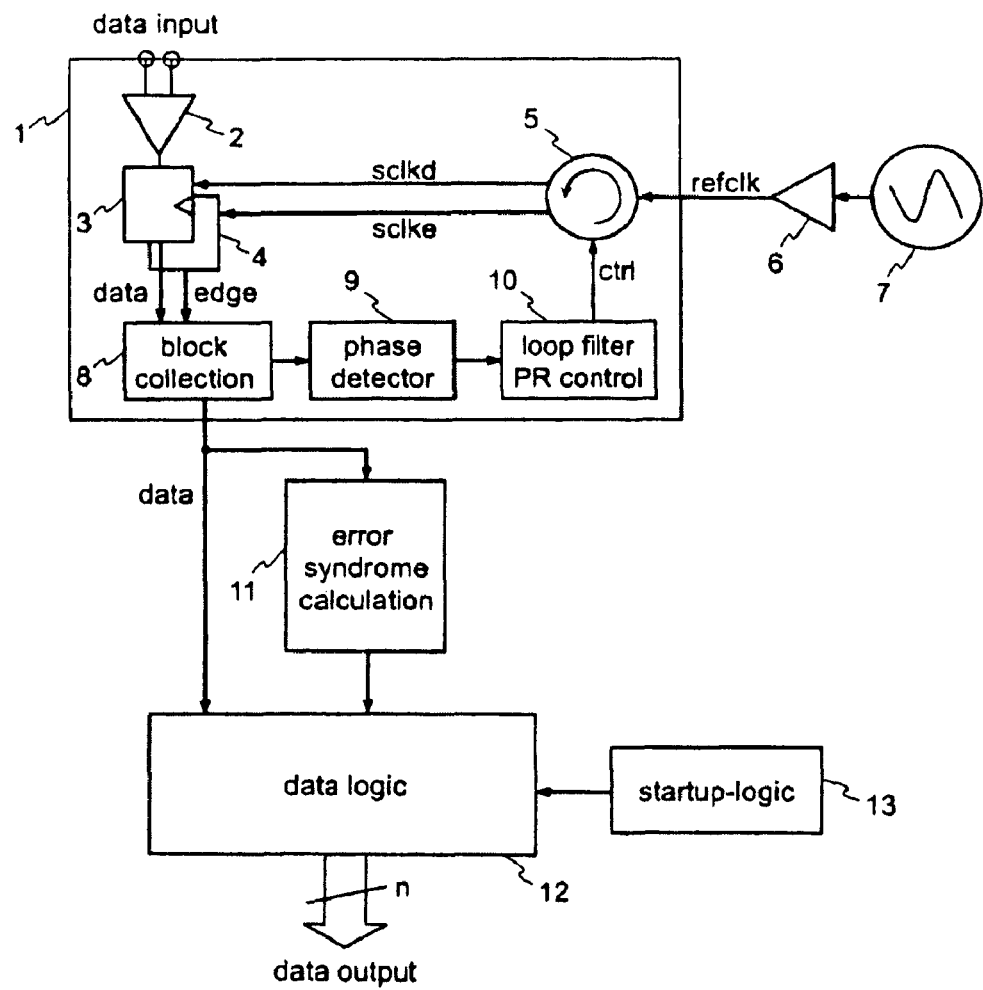
FIG. 1 a block diagram of a clock data recovery loop according to the prior art, FIG. 2 a block diagram of an embodiment of a clock data recovery loop according to the invention, FIG. 3a a timing diagram of an ideal sampling of a data signal, FIG. 3b a timing diagram of a too early sampling of the data signal, FIG. 3c a timing diagram of a too late sampling of the data signal, FIG. 4 a diagram of a simulation of the system according to the invention, and FIG. 5 the stepwise optimization of the phase of the sampling clock.
Figure 5:
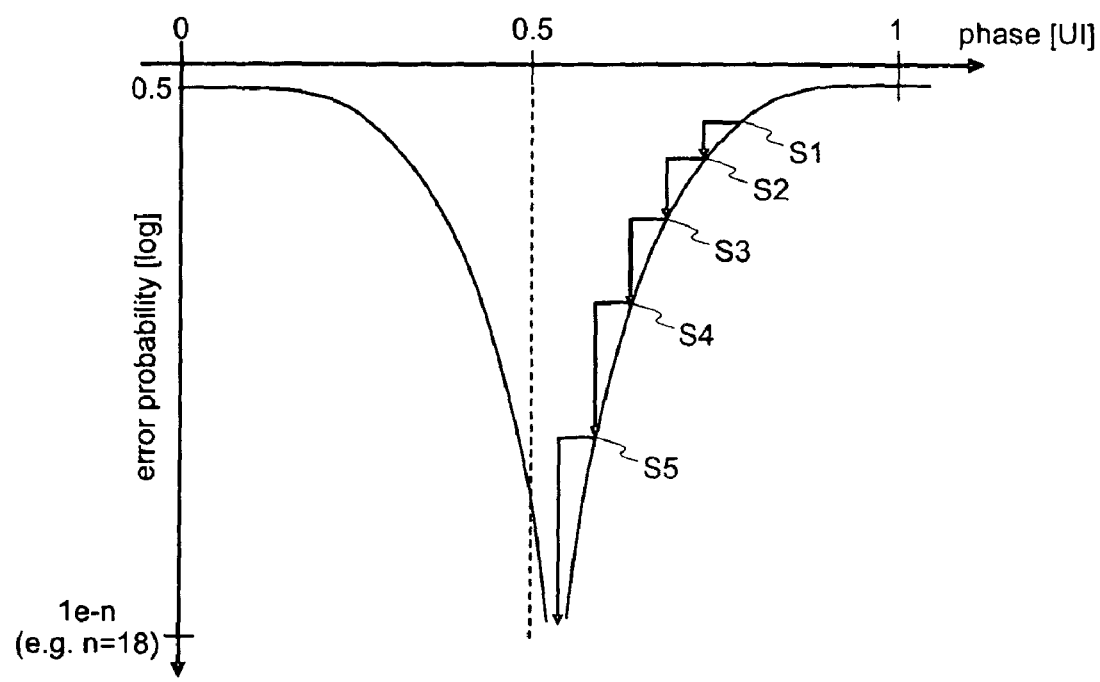

FIG. 5 shows a diagram, in which the error probability versus phase is depicted. The phase is stated as unit interval, UI. The forward error correction code based clock data recovery loop according to the invention may find the optimum sampling clock phase for sampling the received data, wherein the optimum sampling clock phase may be defined here as phase setting for a minimum error. It is noted that in the prior art as mentioned above and shown in FIG. 1 this is not the case. In the CDR as shown in FIG. 1 it may be assumed that the optimum phase is 90 degrees off the bit transitions. In the case of non-symmetric rising and falling edges, this 90 degree position may not necessarily be the ideal data sampling point.

The reference sign S1 indicates that an error is detected by the error syndrome calculation unit 20 and a step is made depending on the phase analysis in the error position and logic transition analysis unit 21, thereby reducing the error probability. After a set of steps, e.g. S2 to S5, the phase setting for the optimum, ie. minimum, error probability may be reached.

It should be noted that the step size may be constant, or may be adapted according to the measured error rate, e.g. a large error rate leads to a large step, and a small error rate leads to a small step. For small error rates, it is possible to make no step to avoid a bang-bang behavior. In the general case, the optimum sampling phase for a minimum error is not necessarily at 0.5 UI, that is, the optimum sampling phase is not necessarily in the center between starting and ending edge of a bit. The closer the data sampling point is to the optimum, the smaller the error density becomes, which advantageously reduces the power consumption.

The principle of the invention is also applicable to cases where the FEC code is transmitted on several parallel serial links. For example, where a 40 bit FEC encoded word is transmitted over 10 individual serial lines, thus, each line transmits a bit quadruple. Each line has a phase rotator in the receiver. By analysis of error distribution in the bit quadruples, an up-down signal can be derived for each individual phase rotator. It is noted that for this to operate optimally, a copy of the previous boundary bit of the bit quadruple is kept so that even an error in the first bit of each bit quadruple can generate an up-down signal. If this is not done, the principle still works, but the loop bandwidth is relatively reduced.

The same principle may also be applied to a multi-level data transmission, e.g. a pulse amplitude modulation, PAM.

The FEC code may not be limited to Hamming codes, but may work with any error correcting code, in particular with codes that correct more than one error.

The principle of the present inventive concept functions for asynchronous data transmission links, it may also function for synchronous or plesiochronous links.

Having illustrated and described an exemplary embodiment for a forward error correction based clock and data recovery system and associated method, it is noted that variations and modifications in the system and method may be made without departing from the scope of the invention.

The invention claimed is:

1. A forward error correction based, clock and data recovery system, comprising:
    a data latch for intermediately storing received data, triggered by a sampling clock;
    an error determination unit for determining which of the sampled received data is wrong, and for generating a phase/frequency correction signal based on whether an error position is before or after a logic transition out of said sampled received data; and
    a clock generator for generating the sampling clock depending on the correction signal.

2. The forward error correction system according to claim 1, wherein the clock generator comprises an adjusting device for adjusting a phase or frequency of the sampling clock.

3. The forward error correction system according to claim 2, wherein the adjusting device comprises one of a phase rotator, a phase interpolator, a voltage controlled oscillator, or a current controlled oscillator.

4. The forward error correction system according to claim 1, further comprising a preamplifier for amplifying the received data provided upstream of the data latch.

5. The forward error correction system according to claim 1, further comprising a data collection unit for block by block collecting the sampled data, said data collection unit being provided between the data latch and the error determination unit.

6. The forward error correction system according to claim 1 wherein the forward error correction system employs one of a Hamming code, a Reed Solomon code, or a convolutional code.

7. The forward error correction system according to claim 1, further comprising a digital filter provided between the error determination unit and the clock generator.

8. The forward error correction system according to claim 1, wherein the system comprises a transmission unit including one of a serial data transmission link, synchronous, plesiochronous, or asynchronous data transmission links, multi level data transmission, or data transmission with pulse amplitude modulation.

9. A method for data and clock recovery in a forward error correction-based clock and data recovery system, comprising:
    receiving a data signal;
    sampling the data signal;
    storing the sampled data signal in a data latch triggered by a sampling clock;
    reading out a value of the sampled data signal in an error determination unit;
    evaluating by the error determination unit whether the value of the sampled data is wrong; and
    adjusting the sampling clock by an adjusting device in a case where the value is wrong based on an error position before or after a logic transition.

10. The method of claim 9, wherein the adjusting further comprises:
    increasing a phase of the sampling clock if the value of the data is unequal to the value of the previous data; and
    decreasing the phase of the sampling clock if the value of the data is equal to the value of the previous data.

11. A non-transitory computer-readable storage medium tangibly encoded with a program of machine-readable instructions executable by a digital processing apparatus to perform a computerized method of claim 9 for data and clock recovery in a forward error correction-based clock and data recovery system.

12. The storage medium of claim 11, wherein a phase of the sampling clock is increased when the error determination unit detects that the value of the sampled data is wrong and unequal to a value of a previous sampled data, and
    wherein the phase of the sampling clock is decreased when the error determination unit detects that the value of the sampled data is wrong and equal to a value of a previous sampled data.

13. A forward error correction based, clock and data recovery system, comprising:
    a sampling clock to provide a sampling clock signal;
    a data latch being configured to receive the sampling clock signal and to sample input data and to output sampled data;
    an error calculation unit being configured to determine if the sampled data includes an error; and
    an error position and logic transition analyzer being configured to determine a basis for the error and to determine whether a phase of the sampling clock should be adjusted based on whether an error position is before or after a logic transition,
wherein the sampling clock adjusts the sampling clock signal according to a determined adjustment of the sampling clock.

14. The forward error correction based, clock and data recovery system of claim 13, further comprising a block collection unit being configured to receive the output sampled data and to convert the output sampled data into parallel data.

15. The forward error correction based, clock and data recovery system of claim 13, further comprising a loop filter to receive an adjustment signal from the error position and logic transition analyzer and to provide the signal to the sampling clock.

16. The forward error correction based, clock and data recovery system of claim 13, wherein a correction signal comprises one of an UP signal and a DOWN signal.

17. The forward error correction based, clock and data recovery system of claim 16, wherein, when a data bit is wrongly detected, a sampling error is determined to occur, and the phase of the sampling clock is adjusted according to a previous data bit,
wherein the phase of the sampling clock is increased when the error calculation unit detects that a value of the data bit is wrong and unequal to a value of the previous data bit, and
wherein the phase of the sampling clock is decreased when the error calculation unit detects that the value of the data bit is wrong and equal to the value of the previous data bit.

18. The forward error correction based, clock and data recovery system of claim 13, further comprising a data input to receive data and to provide the data to the data latch.

* * * * *